(12) United States Patent
Holmes

(10) Patent No.: US 6,688,119 B2
(45) Date of Patent: Feb. 10, 2004

(54) METHODS AND APPARATUS FOR INCREASING APPLIANCE MEASURING SYSTEM ACCURACY

(75) Inventor: John Steven Holmes, Sellersburg, IN (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/742,532

(22) Filed: Dec. 22, 2000

(65) Prior Publication Data

US 2003/0010089 A1 Jan. 16, 2003

(51) Int. Cl.[7] .................. F25B 49/00; G01K 15/00; G01K 19/00
(52) U.S. Cl. .................................... 62/127; 374/1
(58) Field of Search ................... 62/127; 374/1; 73/1.01; 324/537, 549, 691, 555

(56) References Cited

U.S. PATENT DOCUMENTS

| | | |
|---|---|---|
| 3,750,155 A | 7/1973 | Oman |
| 4,114,442 A | 9/1978 | Pratt |
| 4,122,719 A | 10/1978 | Carlson et al. |
| 4,324,138 A | 4/1982 | Davis et al. |
| 4,387,578 A | 6/1983 | Paddock |
| 4,441,329 A | 4/1984 | Dawley |
| 4,442,716 A | 4/1984 | Coe et al. |
| 4,473,797 A | 9/1984 | Shiota |
| 4,480,312 A | 10/1984 | Wingate |
| 4,490,986 A | 1/1985 | Paddock |
| 4,532,601 A | 7/1985 | Lenderking et al. |
| 4,535,598 A | 8/1985 | Mount |
| 4,563,682 A | 1/1986 | Merkel |
| 4,642,636 A | 2/1987 | Smith et al. |
| 4,669,052 A | 5/1987 | Bianco |
| 4,704,609 A | 11/1987 | Rittenberry et al. |
| 4,873,655 A | 10/1989 | Kondraske |
| 4,875,042 A | 10/1989 | Oku et al. |
| 4,937,535 A | 6/1990 | Underwood et al. |
| 5,095,453 A | 3/1992 | Pierson et al. |
| 5,276,631 A | 1/1994 | Popovic et al. |
| 5,311,762 A | 5/1994 | Drexel |
| 5,398,251 A | 3/1995 | Shim |
| 5,499,023 A * | 3/1996 | Goldschmidt ........... 340/870.37 |
| 5,502,659 A | 3/1996 | Braster et al. |
| 5,586,061 A | 12/1996 | Williams et al. |
| 5,604,684 A | 2/1997 | Juntunen |
| 5,653,239 A * | 8/1997 | Pompei et al. ............. 128/664 |
| 5,703,575 A | 12/1997 | Kirkpatrick |
| 5,713,668 A | 2/1998 | Lunghofer et al. |
| 5,740,080 A | 4/1998 | Shook et al. |
| 5,764,541 A | 6/1998 | Hermann et al. |
| 5,775,809 A | 7/1998 | Cooley et al. |
| 5,781,024 A * | 7/1998 | Blomberg et al. ........... 324/763 |
| 5,887,978 A | 3/1999 | Lunghofer et al. |
| 6,189,382 B1 * | 2/2001 | Johnson .................. 73/504.13 |
| 6,280,081 B1 * | 8/2001 | Blau et al. ................... 374/1 |
| 6,344,747 B1 * | 2/2002 | Lunghofer et al. .......... 324/537 |
| 2002/0094010 A1 * | 7/2002 | Vail t al. ................... 374/183 |

* cited by examiner

Primary Examiner—Marc Norman
(74) Attorney, Agent, or Firm—H. Neil Houser, Esq.; Armstrong Teasdale, LLP

(57) ABSTRACT

A reduced error measurement system for use in, for example, an appliance control system includes a multiplexor, a plurality of sensors coupled to the multiplexor, and a single amplifier circuit having an impedance path. The multiplexor is configured to selectively place one of the sensors into the impedance path of the amplifier. A transfer function of an amplifier circuit is dependent upon a selected sensor response when placed into the circuit, thereby allowing a controller to make control decisions based upon a voltage output of the single amplifier, thereby reducing errors attributable to a plurality of amplifier channels. An adjacent channel calibration technique is used to calibrate a hard mounted sensor to an integrated circuit that applies a calibrated offset value determined with a removable sensor coupled to the integrated circuit to the hard mounted sensor.

35 Claims, 7 Drawing Sheets

METHODS AND APPARATUS FOR INCREASING APPLIANCE MEASURING SYSTEM ACCURACY

BACKGROUND OF THE INVENTION

This invention relates generally to control systems for appliances, and more particularly, to calibration and multiplexing of a plurality of sensors used in appliance control systems.

Known household appliances are available in various platforms having different structural features, operational features, and controls. For example, known refrigerator platforms include side-by-side single and double fresh food and freezer compartments, and vertically oriented fresh food and freezer compartments including top mounted freezer compartments, and bottom mounted freezer compartments. Conventionally, a different control system is used in each refrigerator platform. For example, a control system for a side-by-side refrigerator typically controls the fresh food temperature by controlling operation of a mullion damper located between the fresh food compartment and the freezer compartment, a fresh food fan and a variable or multi-speed fan-speed evaporator fan. Top mount refrigerators and bottom mount refrigerators however, are available with and without a mullion damper, the absence or presence of which consequently affects the refrigerator controls. Other major appliances, including dishwashers, washing machines, dryers and ranges, are available in various platforms and employ different control schemes.

Known electronically controlled appliances typically employ a dedicated connection between a controller and a plurality of peripheral devices, including but not limited to sensors to monitor various operating conditions of the appliance. Consequently, it is necessary to calibrate the sensors so that signals from the sensors may be corrected for system measurement and voltage errors. Occasionally, it is desirable to mount a sensor directly to a printed circuit board. Calibration of such hard mounted sensors, however, is problematic.

In addition, in some types of electronic control systems, a plurality of sensors are coupled to one or more analog-to-digital (A/D) converters through multiplexors. To facilitate signal processing, each sensor is coupled to an amplifier to produce a signal compatible with the A/D input. Each amplifier channel, however, typically adds error to the respective sensor signals, and multiplexing sensors together through a plurality of amplifiers increases sensor to sensor bias or error because of several modes of error associated with each of the amplifiers.

BRIEF SUMMARY OF THE INVENTION

In an exemplary embodiment, a measurement system for use in, for example, an appliance control system includes a multiplexor, a plurality of sensors coupled to the multiplexor, and a single amplifier circuit having an impedance path. The multiplexor is configured to selectively place one of the sensors into the impedance path of the amplifier. In different embodiments, the sensors are placed into an amplifier input impedance path, and an amplifier feedback impedance path. Transfer functions of the amplifier circuits are dependent upon a selected sensor response when placed into the circuit, thereby allowing a controller to make control decisions based upon a voltage output of the amplifier. Because a single amplifier channel is used to read all the sensors, measurement error attributable to a plurality of amplifier channels is reduced.

In another aspect, the measurement system includes an integrated circuit having at least a first channel, a second channel, and a hard mounted sensor directly mounted to the first channel. An adjacent channel calibration technique is used to calibrate the hard mounted sensor by coupling a removable sensor to the second channel and calibrating the second channel by measuring signals with the removable sensor and at least one known equivalent source, such as a tight tolerance resistor. Using the known and expected values, a sensor offset value is determined for the second channel, and the sensor offset is applied to both the first channel and the second channel as the respective sensors are read by the controller. A cost effective hard mounted sensor is therefore provided that may be calibrated before the circuit board is installed in the field.

Therefore a measurement system with reduced error provides increased measurement accuracy to meet increased performance objectives of, for example, major appliances including a plurality of thermistors for selection, execution, and feedback control of operating algorithms of an appliance.

DETAILED DESCRIPTION OF THE INVENTION

Figure 1:
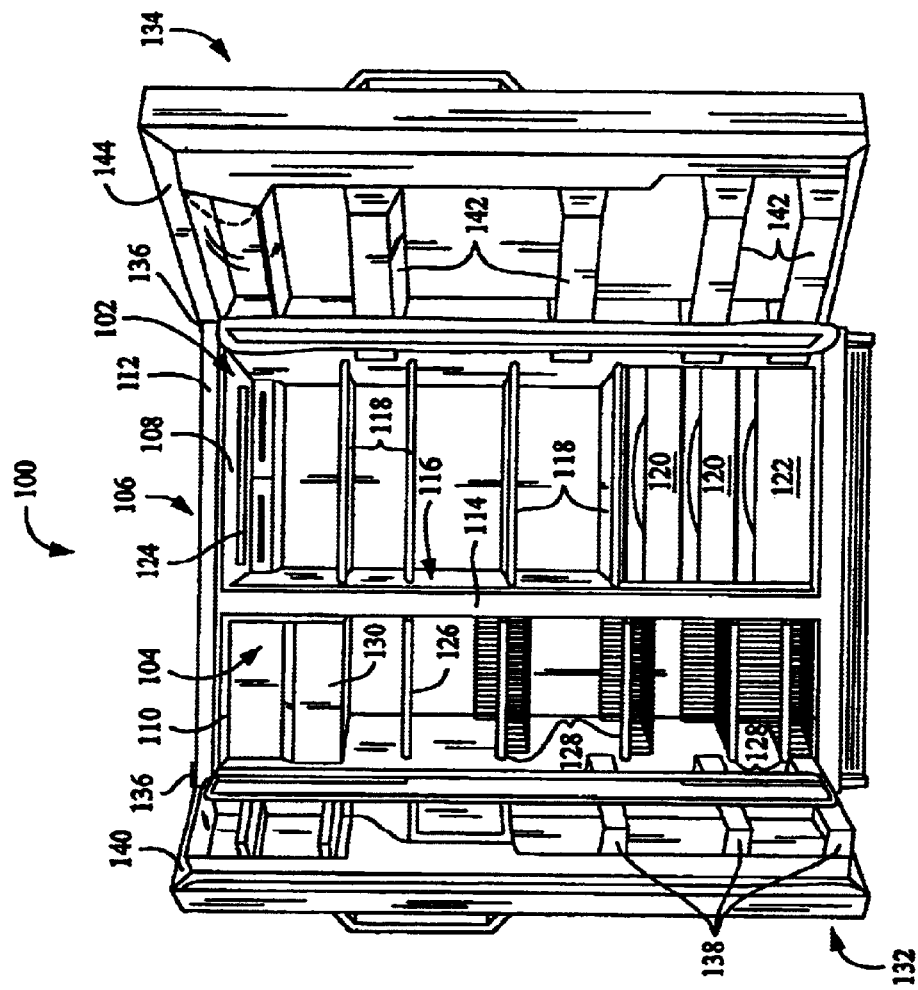
FIG. 1 is a perspective view of a refrigerator.

FIG. 1 illustrates a side-by-side refrigerator 100 in which the present invention may be practiced. It is recognized, however, that the benefits of the present invention apply to other types of appliances utilizing a plurality of peripheral devices communicating with an electronic controller. Consequently, the description set forth herein is for illustrative purposes only and is not intended to limit the invention to practice with a particular appliance, such as refrigerator 100.

Refrigerator 100 includes a fresh food storage compartment 102 and a freezer storage compartment 104. Freezer compartment 104 and fresh food compartment 102 are arranged side-by-side. A side-by-side refrigerator such as refrigerator 100 is commercially available from General Electric Company, Appliance Park, Louisville, Ky. 40225.

Refrigerator 100 includes an outer case 106 and inner liners 108 and 110. A space between case 106 and liners 108 and 110, and between liners 108 and 110, is filled with foamed-in-place insulation. Outer case 106 normally is formed by folding a sheet of a suitable material, such as pre-painted steel, into an inverted U-shape to form top and side walls of case. A bottom wall of case 106 normally is formed separately and attached to the case side walls and to a bottom frame that provides support for refrigerator 100. Inner liners 108 and 110 are molded from a suitable plastic material to form freezer compartment 104 and fresh food compartment 102, respectively. Alternatively, liners 108, 110 may be formed by bending and welding a sheet of a suitable metal, such as steel. The illustrative embodiment includes two separate liners 108, 110 as it is a relatively large capacity unit and separate liners add strength and are easier to maintain within manufacturing tolerances. In smaller refrigerators, a single liner is formed and a mullion spans between opposite sides of the liner to divide it into a freezer compartment and a fresh food compartment.

A breaker strip 112 extends between a case front flange and outer front edges of liners. Breaker strip 112 is formed from a suitable resilient material, such as an extruded acrylo-butadiene-styrene based material (commonly referred to as ABS).

The insulation in the space between liners 108, 110 is covered by another strip of suitable resilient material, which also commonly is referred to as a mullion 114. Mullion 114 also preferably is formed of an extruded ABS material. It will be understood that in a refrigerator with separate mullion dividing a unitary liner into a freezer and a fresh food compartment, a front face member of mullion corresponds to mullion 114. Breaker strip 112 and mullion 114 form a front face, and extend completely around inner peripheral edges of case 106 and vertically between liners 108, 110. Mullion 114, insulation between compartments, and a spaced wall of liners separating compartments, sometimes are collectively referred to herein as a center mullion wall 116.

Shelves 118 and slide-out drawers 120 normally are provided in fresh food compartment 102 to support items being stored therein. A bottom drawer or pan 122 partly forms a quick chill and thaw system (not shown) and selectively controlled, together with other refrigerator features, by a microprocessor (not shown in FIG. 1) according to user preference via manipulation of a control interface 124 mounted in an upper region of fresh food storage compartment 102 and coupled to the microprocessor. A shelf 126 and wire baskets 128 are also provided in freezer compartment 104. In addition, an ice maker 130 may be provided in freezer compartment 104.

A freezer door 132 and a fresh food door 134 close access openings to fresh food and freezer compartments 102, 104, respectively. Each door 132, 134 is mounted by a top hinge 136 and a bottom hinge (not shown) to rotate about its outer vertical edge between an open position, as shown in FIG. 1, and a closed position (not shown) closing the associated storage compartment. Freezer door 132 includes a plurality of storage shelves 138 and a sealing gasket 140, and fresh food door 134 also includes a plurality of storage shelves 142 and a sealing gasket 144.

In accordance with known refrigerators, refrigerator 100 also includes a machinery compartment (not shown) that at least partially contains components for executing a known vapor compression cycle for cooling air. The components include a compressor (not shown in FIG. 1), a condenser (not shown in FIG. 1), an expansion device (not shown in FIG. 1), and an evaporator (not shown in FIG. 1) connected in series and charged with a refrigerant. The evaporator is a type of heat exchanger which transfers heat from air passing over the evaporator to a refrigerant flowing through the evaporator, thereby causing the refrigerant to vaporize. The cooled air is used to refrigerate one or more refrigerator or freezer compartments via fans (not shown in FIG. 1).

Collectively, the vapor compression cycle components in a refrigeration circuit, associated fans, and associated compartments are referred to herein as a sealed system. The construction of the sealed system is well known and therefore not described in detail herein, and the sealed system is operable to force cold air through the refrigerator in response to sensed conditions via a plurality of sensors (not shown in FIG. 1).

Figure 2:
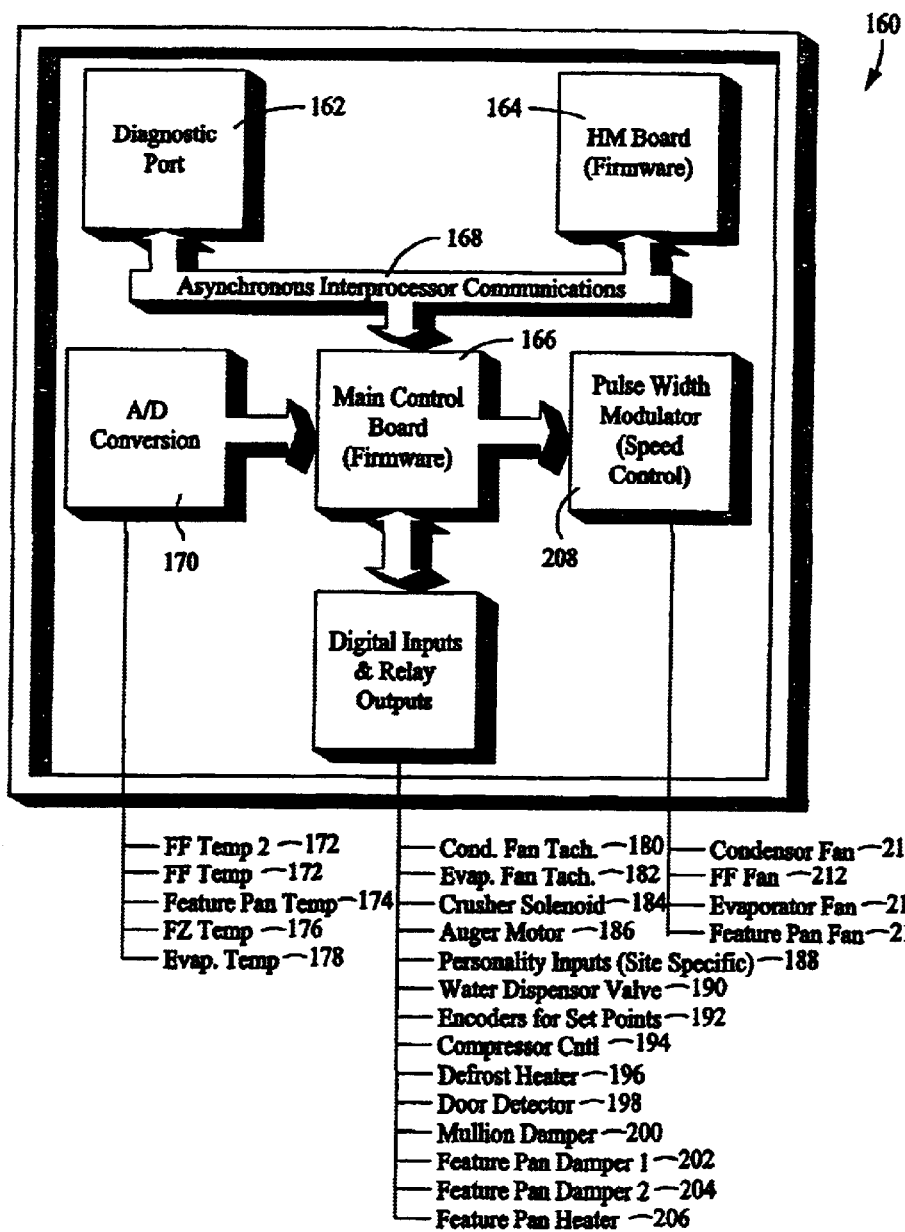
FIG. 2 is a block diagram of a refrigerator controller in accordance with one embodiment of the present invention.

FIG. 2 illustrates an exemplary controller 160 in accordance with one embodiment of the present invention. Controller 160 can be used, for example, in refrigerators, freezers and combinations thereof, including but not limited to refrigerator 100 (shown in FIG. 1). It is recognized, however, that controller 160 is easily adaptable to control other types of appliances, including but not limited to dishwashers, washing machines, dryers and ranges in light of the principles set forth below.

Controller 160 includes a diagnostic port 162 and a human machine interface (HMI) board 164 coupled to a main control board 166 by an asynchronous interprocessor communications bus 168. An analog to digital converter ("A/D converter") 170 is coupled to main control board 166. A/D converter 170 converts analog signals from a plurality of sensors including one or more fresh food compartment temperature sensors 172, a quick chill/thaw feature pan (i.e., pan 122 sown in FIG. 1) temperature sensors 174 (shown in FIG. 8), freezer temperature sensors 176, external temperature sensors (not shown in FIG. 2), and evaporator temperature sensors 178 into digital signals for processing by main control board 166.

In an alternative embodiment (not shown), A/D converter 170 digitizes other input functions (not shown), such as a power supply current and voltage, brownout detection, compressor cycle adjustment, analog time and delay inputs (both use based and sensor based) where the analog input is coupled to an auxiliary device (e.g., clock or finger pressure activated switch), analog pressure sensing of the compressor sealed system for diagnostics and power/energy optimization. Further input functions include external communication via IR detectors or sound detectors, HMI display dimming based on ambient light, adjustment of the refrigerator to react to food loading and changing the air flow/pressure accordingly to ensure food load cooling or heating as desired, and altitude adjustment to ensure even food load cooling and enhance pull-down rate of various altitudes by changing fan speed and varying air flow.

Digital input and relay outputs correspond to, but are not limited to, a condenser fan speed 180, an evaporator fan speed 182, a crusher solenoid 184, an auger motor 186, personality inputs 188, a water dispenser valve 190, encoders 192 for set points, a compressor control 194, a defrost heater 196, a door detector 198, a mullion damper 200, feature pan air handler dampers 202, 204, and a quick chill/thaw feature pan heater 206. Main control board 166 also is coupled to a pulse width modulator 208 for controlling the operating speed of a condenser fan 210, a fresh food compartment fan 212, an evaporator fan 214, and a quick chill system feature pan fan 216.

FIGS. 3A, 3B, 3C, and 4 are more detailed block diagrams of main control board 166. As shown in FIGS. 3A, 3B, 3C, and 4, main control board 166 includes a processor 230. Processor 230 performs temperature adjustments/dispenser communication, AC device control, signal conditioning, microprocessor hardware watchdog, and EEPROM read/write functions. In addition, processor executes many control algorithms including sealed system control, evaporator fan control, defrost control, feature pan control, fresh food fan control, stepper motor damper control, water valve control, auger motor control, cube/crush solenoid control, timer control, and self-test operations.

Processor 230 is coupled to a power supply 232 which receives an AC power signal from a line conditioning unit 234. Line conditioning unit 234 filters a line voltage which is, for example, a 90–265 Volts AC, 50/60 Hz signal. Processor 230 also is coupled to an EEPROM 236 and a clock circuit 238.

A door switch input sensor 240 is coupled to fresh food and freezer door switches 242, and senses a door switch state. A signal is supplied from door switch input sensor 240 to processor 230, in digital form, indicative of the door switch state. Fresh food thermistors 244, a freezer thermistor 246, at least one evaporator thermistor 248, a feature pan thermistor 250, and an ambient thermistor 252 are coupled to processor 230 via a sensor signal conditioner 254. Conditioner 254 receives a multiplex control signal from processor 230 and provides analog signals to processor 230 representative of the respective sensed temperatures. Processor 230 also is coupled to a dispenser board 256 and a temperature adjustment board 258 via a serial communications link 260. Conditioner 254 also calibrates the above-described thermistors 244, 246, 248, 250, and 252.

Processor 230 provides control outputs to a DC fan motor control 262, a DC stepper motor control 264, a DC motor control 266, and a relay watchdog 268. Watchdog 268 is coupled to an AC device controller 270 that provides power to AC loads, such as to water valve 190, cube/crush solenoid 184, a compressor 272, auger motor 186, a feature pan heater 206, and defrost heater 196. DC fan motor control 266 is coupled to evaporator fan 214, condenser fan 210, fresh food fan 212, and feature pan fan 216. DC stepper motor control 266 is coupled to mullion damper 200, and DC motor control 266 is coupled to one of more sealed system dampers. The foregoing functions of the above-described electronic control system are performed under the control of firmware implemented as small independent state machines.

Controller 160 is responsive to sensor inputs to make control decisions. For example, in one embodiment, feature pan 122 (shown in FIG. 1) is a quick chill and thaw pan controlled according to temperature gradients determined by feature pan thermistors. Likewise, defrost algorithms and chill algorithms depend at least in part on actual temperature conditions in fresh food compartment 102 (shown in FIG. 1) and freezer compartment 104 (shown in FIG. 1). To accurately control these and other function in refrigerator 100 (shown in FIG. 1), properly calibrated thermistors and sensors are desired to account for system measurement errors.

One method of calibrating measuring systems is to remove one of the sensors, replace it with a known equivalent source (e.g., a tight tolerance resistor) having a resistance equal to an expected resistance of the sensor at a designated temperature, and read the value of the A/D converter. This technique supplies a known or measured value and an expected value. Once the expected and the measured value are known, a sensor offset is calculated. The offset is applied to future readings of the thermistor to correct for system voltage and measurement error. Thus, a single point calibration slope is determined wherein the slope is assumed to be constant and only the offset is applied to the sensor signal for future temperature sensing. The above process is repeated to calculate each of a plurality of sensors in the system. Offsets for each of the various sensors are stored in system memory 236 (shown in FIG. 3A), and processor 230 (shown in FIG. 3B) applies the offsets as the sensors are read.

Alternatively, a two point calibration slope technique employs two precision sources and two expected values to calculate a slope and an offset for each of a variety of sensors. The offset and optional slope are stored in non-volatile memory 236 (shown in FIG. 3A). Thereafter, each time a measurement is made from a sensor, the respective calibration slope and offset are applied to the physical value by processor 230 (shown in FIG. 3B) to correct for system voltage and measurement errors. Thus, a calibration slope m is determined according to the following relationship:

$$m = \frac{(ExpectedValue1 - ExpectedValue2)}{(A/DCounts1 - A/DCounts2)} \quad (1)$$

and a calibration offset B is determined by the relationship:

$$B = ExpectedValue1 - (A/DCounts1 * m) \quad (2).$$

Thus, by properly calibrating the measurement channels, such as by either of the above-described techniques, accurate measurements may be made of thermistor readings while compensating for system error.

Figure 3:
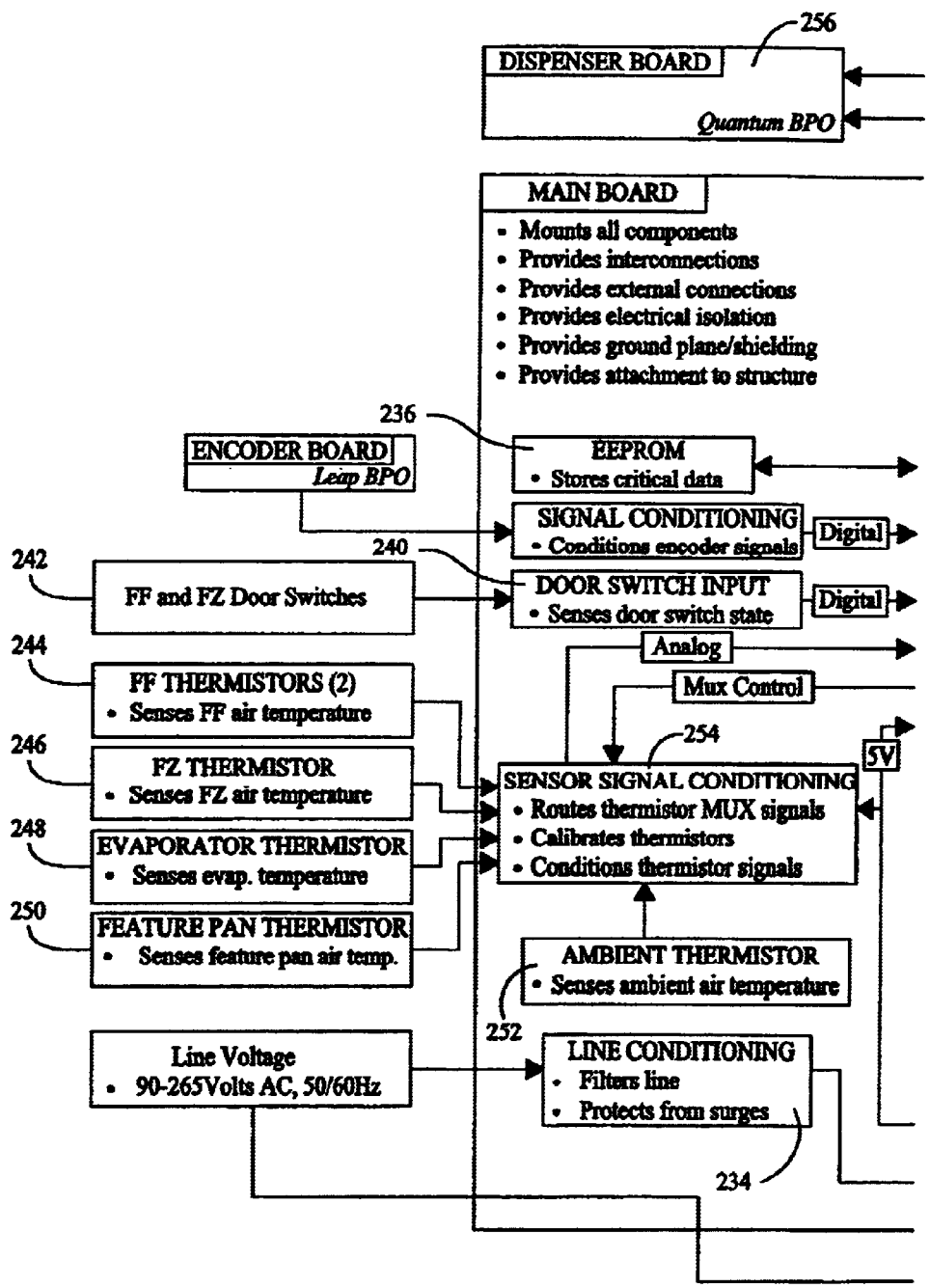
FIG. 3A is a first portion of a block diagram of the main control board shown in FIG. 2.
FIG. 3B is a second portion of a block diagram of the main control board shown in FIG. 2.
FIG. 3C is a third portion of a block diagram of the main control board shown in FIG. 2.
Figure 3A:
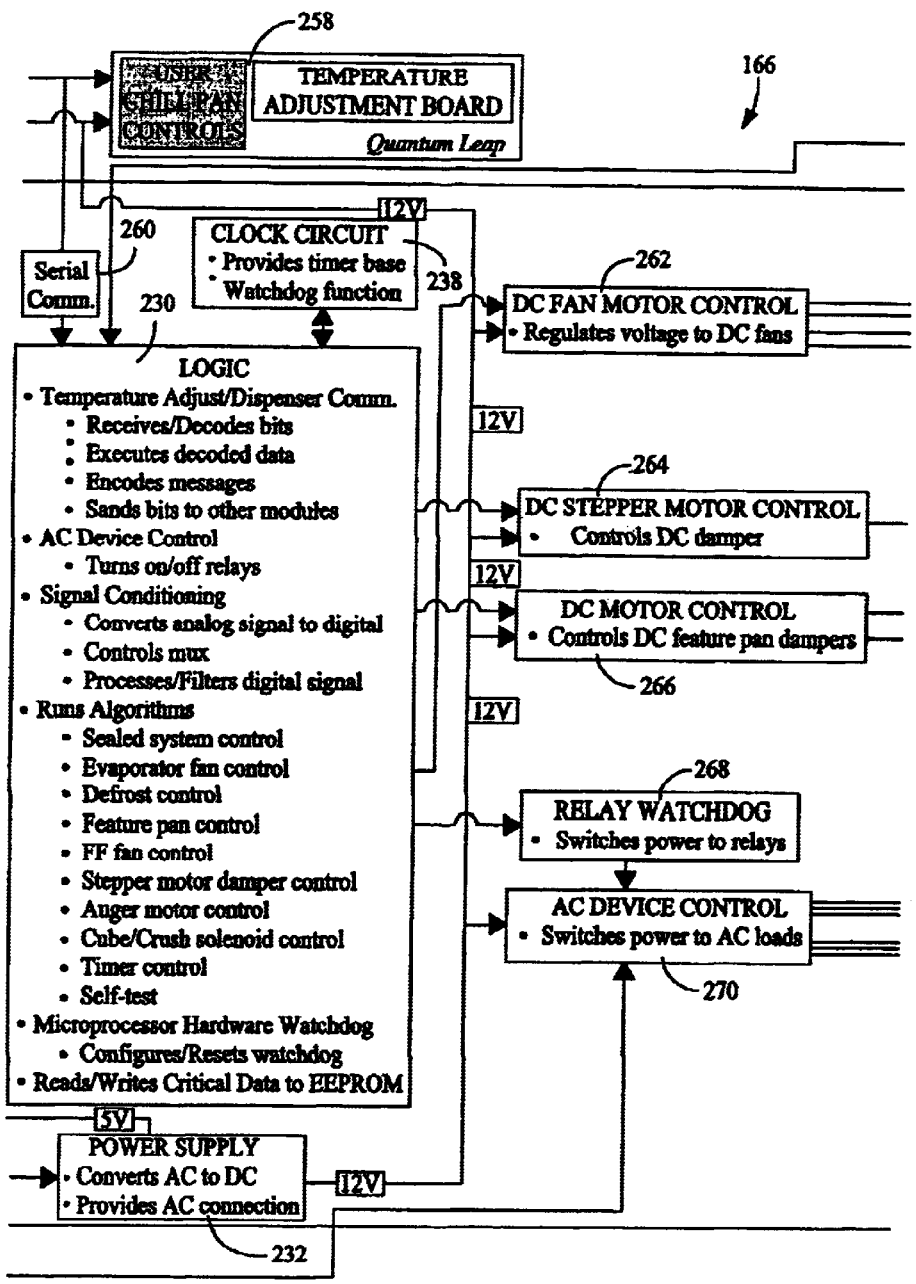
Figure 4:
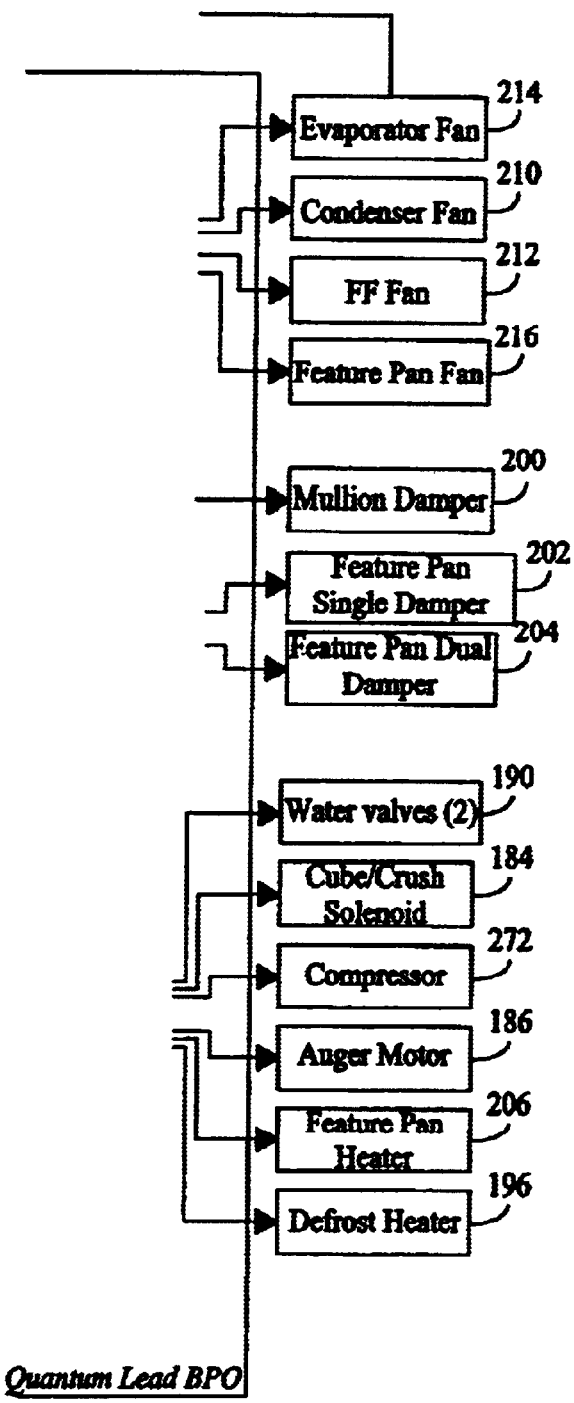
FIG. 4 is a block diagram of the main control board shown in FIG. 2.

For executing certain functions of refrigerator 100 (shown in FIG. 1), in addition to determining internal temperatures of the various refrigeration compartments, it is desirable to determine ambient temperature conditions as well, i.e., temperature conditions outside of the refrigerator compartments, such as with ambient sensor 252 (shown in FIG. 3A). A practical and cost effective way to accomplish this is to mount a thermistor directly to a printed circuit board of controller 160 (shown in FIG. 2), which is located external to refrigerator compartments 102, 104 (shown in FIG. 1). However, as a direct mounted thermistor is not removable from the sensing circuit, the above described calibration schemes are generally inapplicable to calibrate the measurement channels of hard mounted thermistors.

However, it has been observed that when a signal is switched or amplified on an integrated circuit (IC), it tends to have the same offsets and other distortions as the other channels on the same IC. Since at least some of the sensors employed with refrigerator 100 are removable (by connectors) and some are mounted to a controller printed wiring board (PWB), such as main control board 166 (shown in FIGS. 2–4), Adjacent Channel Calibration may be used to calibrate the hard mounted sensors. Accordingly, a channel with a removable sensor is calibrated as described above and then the calibration slope and/or offset for the removable sensor is applied to the hard mounted sensor, provided that the hard mounted sensor channel being calibrated follows a path through the same IC as the channel calibrated with a removable sensor.

Using Adjacent Channel Calibration, a hard mounted thermistor may be calibrated where the PWB is manufactured, rather than conventional calibration when controller 160 is installed into refrigerator 100 at a known stable reference temperature. Thus, a cost effective hard mounted sensor may be calibrated and used in lieu of conventional sensors and calibration techniques with added cost.

Figure 5:
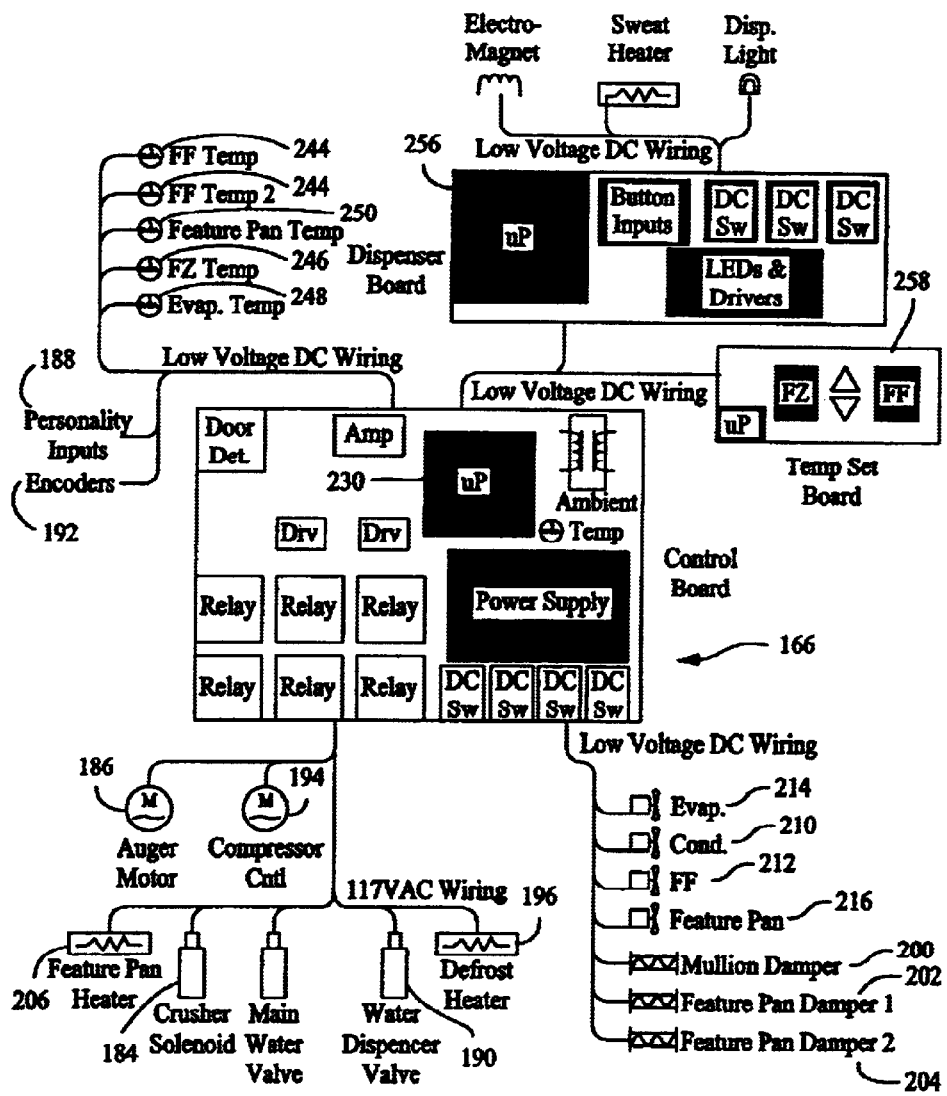
FIG. 5 is a schematic diagram of a first thermistor multiplexing scheme.

In addition, and as illustrated in FIG. 5, measurement error attributable to multiple amplifier channels for a plurality of sensors may be reduced with multiplexing scheme 300 including an analog multiplexor 302 connected in a feedback path 304 of an amplifier 306. Multiplexor 302 is used to select a sensor of interest and place it in feedback path 304 of amplifier 306. Such an arrangement reduces component count i.e., an amplifier and a multiplexor instead of an amplifier for each sensor, which reduces costs and increases system reliability. Also, all sensors are read using the same amplifier 306, thereby using only one amplifier channel. Thus, cumulative error attributable to multiple amplification channels is avoided.

Referring to FIG. 5, R1 through R8 represent known temperature thermistors, such as thermistors 242, 244, 246, 248, 250, and 252 (shown in FIG. 3A). Controller processor 230 (shown in FIG. 3B) or another control circuit (not shown) selects a thermistor to read by placing a binary number (000–111) on three select lines 308 to connect a given thermistor $R_i$ in feedback path 304 of op amp 306. When selected, each thermistor $R_i$ is in series with the on resistance of multiplexor 302. Since each thermistor $R_i$ provides a resistance that is proportional to temperature, the selected thermistor $R_i$ sets the gain of amplifier 306 according to the temperature it is measuring $R_T$. An output voltage 310 ($V_{out}$) of amplifier 306 is determined according to the following relationship:

$$V_{out} = V_{ref}\left(1 + \frac{R_t}{R_i}\right). \quad (3)$$

Thus, a temperature of a given sensor $R_i$ is indicated from output voltage $V_{out}$ of op amp 306 when sensor $R_i$ is placed into the circuit by multiplexor 302.

Figure 6:
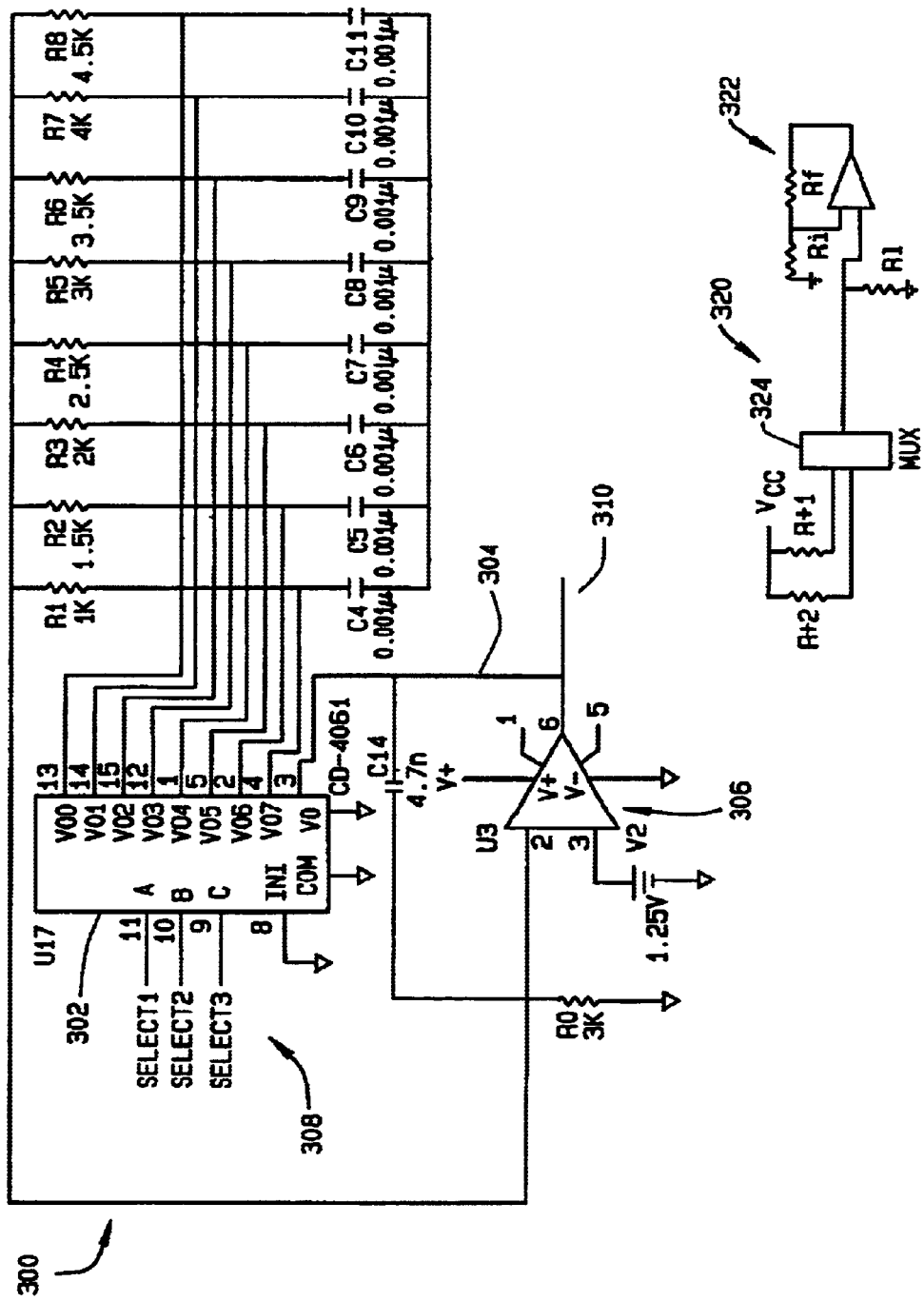
FIG. 6 is a schematic diagram of a second alternative thermistor multiplexing scheme.

FIG. 6 illustrates an alternative multiplexing scheme 320 for reducing measurement error wherein one of a plurality of sensors is selectively placed into an amplifier circuit 322 through a multiplexor 324 at the amplifier input impedance, as opposed to the amplifier's feedback impedance (as shown in FIG. 5). Multiplexing scheme 320 has the following transfer function from which a temperature of a sensor $R_i$ may be determined:

$$V_{out} = \left(1 + \frac{R_f}{R_i}\right) * \left(V_{CC} * \frac{R_1}{(R_1 + R_t)}\right). \quad (4)$$

Thus, a temperature of sensor $R_i$ is indicated from the output voltage $V_{out}$ of op amp when sensor $R_i$ is placed into an amplifier circuit 322 by multiplexor 324.

In further embodiments, either of multiplexing schemes 300, 320 described above is enhanced by employing an additional A/D channel (not shown). The additional A/D channel reads the sensor directly (without passing through the amplifier), and can be used to sense temperatures outside of an expected dynamic range of the amplifier, to detect a failed amplifier, and to provide a reduced performance fail safe mode of operation.

While the invention has been described in terms of various specific embodiments, those skilled in the art will recognize that the invention can be practiced with modification within the spirit and scope of the claims.

What is claimed is:

1. A method for reducing measurement error in a measurement system including a plurality of thermistors, a multiplexor, and a single amplifier circuit having an impedance path, said method comprising the steps of:
    calibrating each of the plurality of thermistors;
    coupling each of the thermistors to the multiplexor; and
    selectively supplying an output of one of the thermistors through the multiplexor to the impedance path.

2. A method in accordance with claim 1 wherein said step of calibrating each of the sensors comprises the step of calibrating at least one of the sensors with a single point calibration slope technique to determine at least one sensor offset.

3. A method in accordance with claim 2, the measurement system including a memory, said method further comprising the step of storing the at least one sensor offset in the memory.

4. A method in accordance with claim 3, the measurement system including a processor, said method further comprising the steps of:
    retrieving the sensor offset from memory when a reading of the at least one sensor is desired; and
    applying the stored offset value to the at least one sensor signal to compensate for system error.

5. A method in accordance with claim 2 wherein said step of calibrating each of the sensors comprises the step of calibrating at least one of the sensors with a two point calibration slope technique to determine a sensor slope and a sensor offset.

6. A method in accordance with claim 5, the measurement system including a memory, said method further comprising the step of storing the at least one sensor slope and at least one sensor offset in the memory.

7. A method in accordance with claim 6, the measurement system including a processor, said method further comprising the steps of:
    retrieving the at least one sensor slope and at least one sensor offset from memory when a reading of the at least one sensor is desired; and
    applying the stored sensor slope value and the stored sensor offset value to the at least one sensor signal to compensate for system error.

8. A method in accordance with claim 5 wherein said step of selectively supplying an output of one of the sensors through the multiplexor to the impedance path further comprises the step of supplying the selected sensor output at an input impedance path of the amplifier.

9. A method in accordance with claim 1 wherein the measurement system includes at least one hard mounted sensor, the measurement system further including an integrated circuit having at least a first channel and a second channel, the hard mounted sensor mounted to the first channel and a removable sensor coupled to the second channel, said step of calibrating each sensor comprising the steps of:
    calibrating the second channel with the removable sensor to obtain at least a calibration offset value; and
    applying the calibration offset value to the first channel.

10. A method in accordance with claim 9 wherein the measuring system includes at least one analog-to-digital converter configured to receive and convert channel measurement values, said step of calibrating the second channel comprising the steps of:
    replacing the removable sensor with an equivalent source having an expected value;
    obtaining a measured value for the equivalent source using the analog-to-digital converter;
    determining the offset value using the measured value and the expected value.

11. A method in accordance with claim 10 wherein the measurement system includes a memory, said method further comprising the step of storing the offset value in the memory.

12. A method in accordance with claim 11 wherein said step of replacing the removable sensor with an equivalent source having an expected value comprises the step of replacing the removable sensor with a tight-tolerance resistor.

13. A method in accordance with claim 9 wherein the measuring system includes at least one analog-to-digital converter configured to receive and convert channel measurement values, said step of calibrating the second channel comprising the steps of:
    replacing the removable sensor with a first equivalent source having a first expected value;
    obtaining a first measured value for the first equivalent source using the analog-to-digital converter;
    replacing the removable sensor with a second equivalent source having a second expected value;

obtaining a second measured value for the second equivalent source using the analog-to-digital converter; and determining a slope and an offset value using the first and second measured values and the first and second expected values.

14. A method in accordance with claim 13 wherein the measurement system includes a memory, said method further comprising the step of storing the slope and offset values in the memory.

15. A method in accordance with claim 1 further comprising the step of supplying an output of the amplifier to an analog-to-digital converter.

16. A method in accordance with claim 1 wherein said step of selectively supplying an output of one of the sensors through the multiplexor to the impedance path further comprises the step of placing a selected sensor output in series with an on resistance of the multiplexor.

17. A method in accordance with claim 1 wherein said step of selectively supplying an output of one of the sensors through the multiplexor to the impedance path further comprises the step of supplying the selected sensor output to a feedback impedance path of the amplifier.

18. A method in accordance with claim 1 wherein the plurality of sensors include a plurality of thermistors for sensing operating conditions of an appliance, said method further comprising the steps of:

selectively reading at least one of the thermistor outputs with the multiplexor; and making appliance control decisions based at least in part on the thermistor reading.

19. A method in accordance with claim 1 wherein the plurality of sensors include a plurality of thermistors for sensing operating conditions of an appliance, said method further comprising the steps of:

selectively reading at least one of the thermistor outputs with the multiplexor; and making appliance control decisions based at least in part on the thermistor reading.

20. A method for calibrating a hard mounted sensor in an appliance control system, the control system including an integrated circuit having at least a first channel and a second channel, the hard mounted sensor mounted to the first channel and a removable sensor coupled to the second channel, said step of calibrating each sensor comprising the steps of:

calibrating the second channel with the removable sensor to obtain at least a calibration offset value; and applying the calibration offset value to the first channel.

21. A method in accordance with claim 20 wherein the measuring system includes at least one analog-to-digital converter configured to receive and convert channel measurement values, said step of calibrating the second channel comprising the steps of:

replacing the removable sensor with an equivalent source having an expected value;

obtaining a measured value for the equivalent source using the analog-to-digital converter, and;

determining the offset value using the measured value and the expected value.

22. A method in accordance with claim 21 wherein the measurement system includes a memory, said method further comprising the step of storing the offset value in the memory.

23. A method in accordance with claim 22, the measurement system including a processor, said method further comprising the steps of:

retrieving the sensor offset from memory when a reading of the at least one sensor is desired; and applying the stored offset value to the at least one sensor signal to compensate for system error.

24. A method in accordance with claim 21 wherein said step of replacing the removable sensor with an equivalent source having an expected value comprises the step of replacing the removable sensor with a tight-tolerance resistor.

25. A method in accordance with claim 20 wherein the measuring system includes at least one analog-to-digital converter configured to receive and convert channel measurement values, said step of calibrating the second channel comprising the steps of:

replacing the removable sensor with a first equivalent source having a first expected value;

obtaining a first measured value for the first equivalent source using the analog-to-digital converter;

replacing the removable sensor with a second equivalent source having a second expected value;

obtaining a second measured value for the second equivalent source using the analog-to-digital converter; and determining a slope and an offset value using the first and second measured values and the first and second expected values.

26. A method in accordance with claim 25 wherein the measurement system includes a memory, said method further comprising the step of storing the slope value and offset value in the memory.

27. A method in accordance with claim 26, the measurement system including a processor, said method further comprising the steps of:

retrieving the sensor offset value and slop value from memory when a reading of the at least one sensor is desired; and applying the stored offset value and the stored slope value to the at least one sensor signal to compensate for system error.

28. A measurement system comprising:

a multiplexor;

a plurality of thermistors coupled to the multiplexor; and a single amplifier circuit comprising an impedance path, said multiplexor configured to selectively place one of the thermistors into the impedance path.

29. A measurement system in accordance with claim 28, said impedance path comprising an input impedance path.

30. A measurement system in accordance with claim 28, said impedance path comprising a feedback impedance path.

31. A measurement system in accordance with claim 28 further comprising an integrated circuit comprising at least a first channel and a second channel, and a hard mounted sensor mounted to the first channel.

32. A measurement system in accordance with claim 31 wherein said hard mounted sensor is calibrated with adjacent channel calibration.

33. A measurement system in accordance with claim 32 wherein said hard mounted sensor is calibrated with a single point calibration offset.

34. A measurement system in accordance with claim 32 wherein said hard mounted sensor is calibrated with a two point slope and offset.

35. A measurement system in accordance with claim 31 wherein the measurement system further comprises a controller, said plurality of sensors comprise at least a plurality of thermistors for sensing operating conditions of an appliance, said controller configured to make control decisions based upon a reading of at least one of said plurality of thermistors.

* * * * *

UNITED STATES PATENT AND TRADEMARK OFFICE
CERTIFICATE OF CORRECTION

| | |
|---|---|
| PATENT NO. | : 6,688,119 B2 |
| DATED | : February 10, 2004 |
| INVENTOR(S) | : John Steven Holmes |

It is certified that error appears in the above-identified patent and that said Letters Patent is hereby corrected as shown below:

Column 10,
Line 31, delete "slop" and insert therefor -- slope --.

Signed and Sealed this

Twenty-second Day of November, 2005

JON W. DUDAS
*Director of the United States Patent and Trademark Office*